US009349090B1

(12) United States Patent
Srinivas et al.

(10) Patent No.: US 9,349,090 B1
(45) Date of Patent: *May 24, 2016

(54) SELF TUNING RFID TAGS

(71) Applicant: Impinj, Inc., Seattle, WA (US)

(72) Inventors: Shailendra Srinivas, Nashua, NH (US); Jay Kuhn, Seattle, WA (US); Ronald A. Oliver, Seattle, WA (US); John D. Hyde, Corvallis, WA (US); Christopher J. Diorio, Shoreline, WA (US)

(73) Assignee: IMPINJ, INC., Seattle, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/586,876

(22) Filed: Dec. 30, 2014

Related U.S. Application Data

(63) Continuation of application No. 13/345,654, filed on Jan. 6, 2012, now Pat. No. 8,952,792.

(60) Provisional application No. 61/430,949, filed on Jan. 7, 2011.

(51) Int. Cl.
*H04Q 5/22* (2006.01)
*G06K 19/07* (2006.01)

(52) U.S. Cl.
CPC ........ *G06K 19/0715* (2013.01); *G06K 19/0709* (2013.01)

(58) Field of Classification Search
CPC .......... G06K 19/0709; G06K 19/0715; G06K 19/07752; G06K 19/07754; H01L 31/02021; H01L 31/0428; G05F 1/67
USPC .......... 340/10.1–10.6, 572.1–572.9, 534, 5.6, 340/5.65, 5.26, 5.8, 5.2, 5.86; 455/229, 73, 455/210, 19, 343.3, 127.5, 333, 299; 343/852, 743, 702, 795; 363/139
See application file for complete search history.

(56) References Cited

U.S. PATENT DOCUMENTS

| 7,482,926 | B2 | 1/2009 | Pillai | |
| 7,960,870 | B2 * | 6/2011 | Besser | ........................ G05F 1/67 307/151 |
| 8,045,947 | B2 | 10/2011 | Mandal et al. | |
| 2007/0087719 | A1 * | 4/2007 | Mandal | .................... H01Q 1/22 455/299 |
| 2008/0018479 | A1 * | 1/2008 | Hashimoto | ...... G06K 19/07749 340/572.8 |
| 2008/0055045 | A1 * | 3/2008 | Swan | ............... G06K 19/07749 340/10.1 |
| 2010/0026468 | A1 * | 2/2010 | Nyalamadugu | .. G06K 19/07345 340/10.51 |
| 2010/0259459 | A1 | 10/2010 | August et al. | |

OTHER PUBLICATIONS

Office Action received for U.S. Appl. No. 13/345,654, mailed Mar. 28, 2014 and filed Jan. 6, 2012.

* cited by examiner

*Primary Examiner* — Steven Lim
*Assistant Examiner* — Mancil Littejohn, Jr.
(74) *Attorney, Agent, or Firm* — Turk IP Law, LLC

(57) ABSTRACT

A tuning circuit in an RFID tag may be used to match antenna and integrated circuit (IC) impedances to maximize the efficiency of IC power extraction from an incident RF wave. The tuning circuit, which requires less power to operate than the IC, adjusts a variable impedance to improve the impedance matching between the IC and the tag antenna and thereby increase the IC power extraction efficiency. The IC may begin operating according to a protocol when it extracts sufficient power from the RF wave or when an optimal impedance matching and power transfer is achieved.

20 Claims, 9 Drawing Sheets

SELF TUNING RFID TAGS

CROSS-REFERENCE TO RELATED APPLICATIONS

This application is a continuation under 35 U.S.C §120 of co-pending U.S. patent application Ser. No. 13/345,654 filed on Jan. 6, 2012, which claims the benefit under 35 U.S.C §119(e) of U.S. Provisional Application Ser. No. 61/430,949 filed on Jan. 7, 2011. The disclosures of the U.S. Patent application and the provisional patent application are hereby incorporated by reference in their entireties.

BACKGROUND

Radio-Frequency Identification (RFID) systems typically include RFID readers, also known as RFID reader/writers or RFID interrogators, and RFID tags. RFID systems can be used in many ways for locating and identifying objects to which the tags are attached. RFID systems are particularly useful in product-related and service-related industries for tracking objects being processed, inventoried, or handled. In such cases, an RFID tag is usually attached to an item or to its package.

RFID techniques include an RFID reader interrogating one or more RFID tags. The reader transmitting a Radio Frequency (RF) wave performs the interrogation. The RF wave is typically electromagnetic, at least in the far field. The RF wave can also be predominantly electric or magnetic in the near field.

An RFID tag typically includes a substrate, an antenna formed on the substrate, and an integrated circuit (IC) coupled to the antenna. Some RFID tags employ an energy storage device such as a battery and are known as active or battery-assisted tags. Other RFID tags do not include an energy-storage device such as a battery and are called passive tags. Passive tags rely on energy extracted from the RF wave to power the IC. Of course, even passive tags include temporary energy-storage elements such as capacitors or inductors. Regardless, the efficiency of the RF power transfer from the reader to the passive tag's IC directly affects the operational range of the RFID system.

An RFID tag may include a matching network coupled between the IC and the antenna. The purpose of this matching network is to match the antenna impedance to the IC input impedance to maximize power transfer to the IC. This matching network may employ discrete elements such as capacitors or inductors, or may be formed by the design of the antenna itself. To ensure that as much of the RF power incident on the antenna is transferred to the IC, the source (antenna) impedance should be the complex conjugate of the load (IC) impedance. Unfortunately, antenna impedance may vary with environmental conditions such as humidity, substrate material, dielectric materials near the tag, etc. Similarly, IC impedance may vary with the processing of the IC itself. A matching network that matches antenna and IC impedances for one tag and one frequency under one condition will not match antenna and IC impedances for another IC at another frequency under a different condition. When the impedances vary the matching between the antenna and IC degrades, tag sensitivity degrades, and the operational range of the RFID system is reduced. Consequently, there is a need for ways to tune the IC input impedance to be the complex conjugate of the antenna source impedance under varying conditions.

BRIEF SUMMARY

This summary is provided to introduce a selection of concepts in a simplified form that are further described below in the Detailed Description. This summary is not intended to identify key features or essential features of the claimed subject matter, nor is it intended as an aid in determining the scope of the claimed subject matter.

Embodiments are directed to a tuning circuit used to improve the matching between an antenna and an integrated circuit (IC) in an RFID tag, to increase the amount of power that the IC can extract from an incident RF wave. The tuning circuit, which requires less power to operate than the IC itself, adjusts a variable impedance to improve the impedance match between the IC and the tag antenna. The IC may activate when the tag extracts sufficient power from the RF wave or when the tuning circuit finishes its impedance matching.

These and other features and advantages will be apparent from a reading of the following detailed description and a review of the associated drawings. It is to be understood that both the foregoing general description and the following detailed description are explanatory only and are not restrictive of aspects as claimed.

BRIEF DESCRIPTION OF THE DRAWINGS

The following Detailed Description proceeds with reference to the accompanying drawings, in which.

DETAILED DESCRIPTION

In the following detailed description, references are made to the accompanying drawings that form a part hereof, and in which are shown by way of illustration specific embodiments or examples. These embodiments or examples may be combined, other aspects may be utilized, and structural changes may be made without departing from the spirit or scope of the present disclosure. The following detailed description is therefore not to be taken in a limiting sense, and the scope of the present invention is defined by the appended claims and their equivalents.

The following terms may be used herein as follows. The term "IC" is used herein to mean an RFID Integrated Circuit. The term "inlay" is used herein to refer to a substrate including an antenna and optionally a matching network. The term "tag" is used herein to refer to an inlay with an RFID IC coupled to the antenna. The term "sensitivity" is used to mean the minimum RF power for the IC to operate. The term "variable impedance" is used herein to mean an element whose impedance is adjustable. The term "tuning circuit" is used herein to mean a means for adjusting a variable impedance. The term "SPTT" is used herein to mean sufficient power to tune. The term "EPBT" is used herein to mean the extracted power (by the IC) before tuning. The term "SPOI" is used herein to mean sufficient power to operate the IC (i.e. sensitivity) according to a protocol. A protocol typically describes the interactions and communications between a reader and a tag. As one example, the Class-1 Generation-2 UHF RFID Protocol for Communications at 860 MHz-960 MHz ("Gen2 Specification") by EPCglobal, Inc. is one such protocol. The contents of Gen2 Specification version 1.2.0 are hereby incorporated by reference. The term "EPAT" is used herein to mean extracted power (by the IC) after tuning. The term "VDD" is used herein to mean the IC supply voltage.

Figure 1:
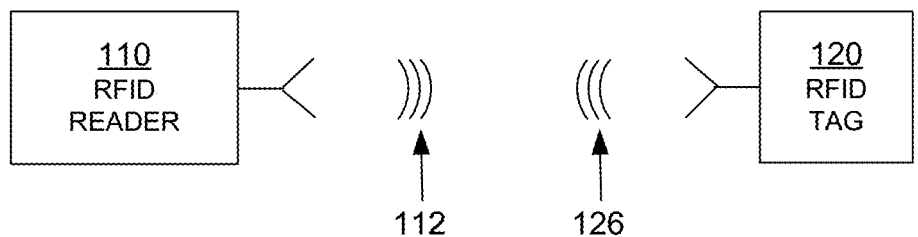
FIG. 1 is a block diagram of components of an RFID system.

FIG. 1 is a diagram of components of a typical RFID system 100, incorporating embodiments. An RFID reader 110 transmits an interrogating radio-frequency (RF) wave 112. RFID tag 120 in the vicinity of RFID reader 110 may sense interrogating RF wave 112 and generate wave 126 in response. RFID reader 110 may sense and interpret wave 126.

Reader 110 and tag 120 exchange data via wave 112 and wave 126. In a session of such an exchange each encodes, modulates, and transmits data to the other, and each receives, demodulates, and decodes data from the other. The data can be modulated onto, and demodulated from, RF waveforms. The RF waveforms are typically in a suitable range of frequencies, such as those near 900 MHz, 2.4 GHz, and so on.

Data exchange can be performed in a number of ways. Protocols are devised for readers and tags to exchange symbols, also called RFID symbols. A symbol for communicating can be a delimiter, a calibration symbol, and so on. Symbols can encode binary data, such as "0" and "1", if desired. When symbols are processed internally by reader 110 and tag 120 they can be considered and treated as numbers having corresponding values, and so on.

Tag 120 can be a passive, semi-active (battery-assisted), or active tag. If RFID tag 120 is a passive tag then it is powered from wave 112.

Figure 2:
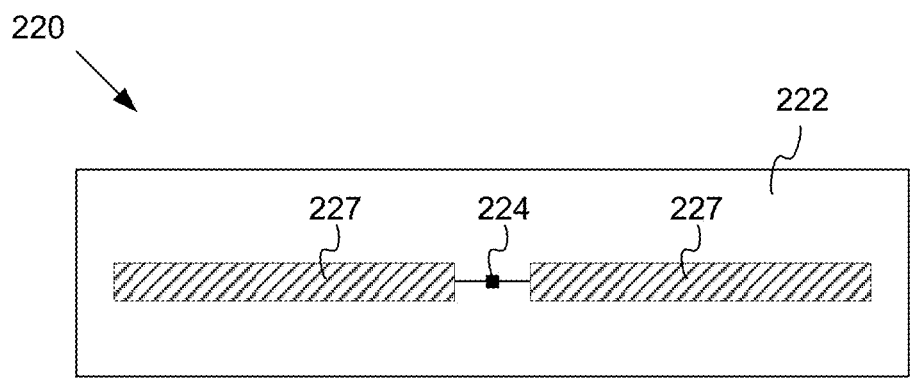
FIG. 2 is a diagram showing components of a passive RFID tag, such as a tag that can be used in the system of FIG. 1.

FIG. 2 is a diagram of an RFID tag 220, which can be the same as RFID tag 120 of FIG. 1. RFID tag 220 is shown as a passive tag. Regardless, much of what is described in this document also applies to semi-active and active tags.

RFID tag 220 is typically formed on a substantially planar inlay 222, which can be made in many ways known in the art. RFID tag 220 includes an electrical circuit 224 which is preferably implemented as an IC. IC 224 is arranged on inlay 222.

RFID tag 220 also includes an antenna for exchanging wireless signals with the environment. The antenna is often flat and attached to inlay 222. IC 224 is electrically coupled to the antenna via suitable antenna terminals (not shown in FIG. 2). The coupling may include a matching network as described below.

The antenna may be made in a number of ways. In the example of FIG. 2, the antenna is made from two distinct antenna segments 227, which are shown here forming a dipole. Many other embodiments are possible, using any number of antenna segments. In some embodiments, the antenna can comprise a single segment, and different points of the single segment can be coupled to one or more of the antenna terminals of IC 224. For example, the antenna can be a loop, with its ends coupled to the IC terminals. It should be remembered that even a single segment can behave like multiple segments at the frequencies of RFID wireless communication.

In operation, an RF signal is received by the antenna and communicated to IC 224. IC 224 extracts power from the RF signal, and responds if appropriate, based on the incoming signal and the IC's internal state. IC 224 may respond by modulating the reflectance of the antenna, which generates backscatter 126 from wave 112 transmitted by the reader. Coupling together and uncoupling the antenna terminals of IC 224 can modulate the antenna's reflectance, as can a variety of other means.

In the embodiment of FIG. 2, antenna segments 227 are separate from IC 224. In other embodiments the antenna segments may be formed on IC 224. Furthermore, an interface element may be used to couple the IC 224 to the antenna segments 227 (not shown in FIG. 2).

The components of the RFID system of FIG. 1 may communicate with each other in any number of modes. One such mode is called full duplex. Another such mode is called half-duplex, and is described below.

Figure 3:
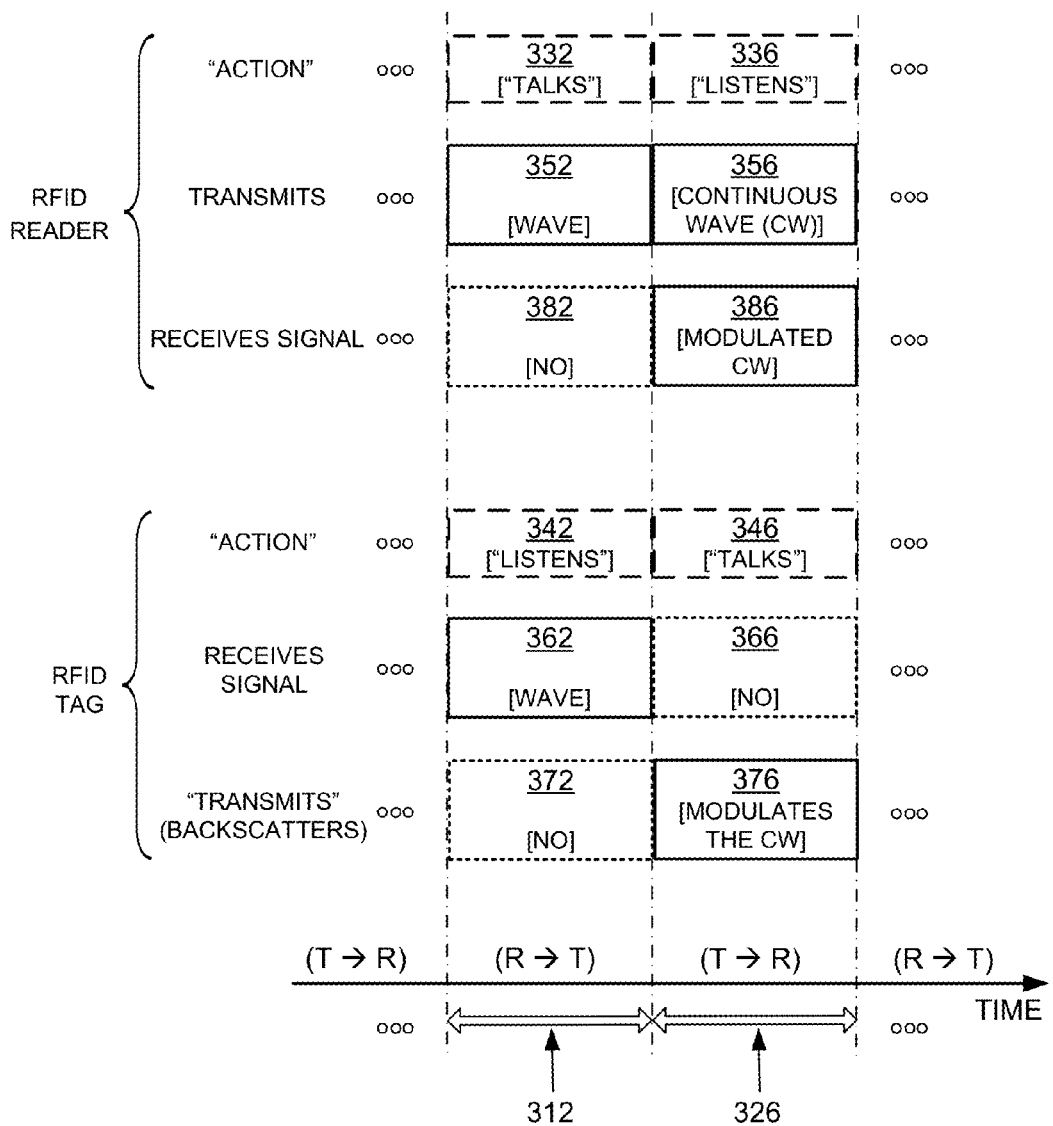
FIG. 3 is a conceptual diagram for explaining a half-duplex mode of communication between the components of the RFID system of FIG. 1.

FIG. 3 is a conceptual diagram 300 for explaining the half-duplex mode of communication between the components of the RFID system of FIG. 1, especially when tag 120 is implemented as passive tag 220 of FIG. 2. The explanation is made with reference to a TIME axis, and also to a human metaphor of "talking" and "listening". The actual technical implementations for "talking" and "listening" are now described.

RFID reader 110 and RFID tag 120 talk and listen to each other by taking turns. As seen on axis TIME, when RFID reader 110 talks to RFID tag 120 the communication session is designated as "R→T", and when RFID tag 120 talks to RFID reader 110 the communication session is designated as "T→R". Along the TIME axis, a sample R→T communication session occurs during a time interval 312, and a following sample T→R communication session occurs during a time interval 326. Of course interval 312 is typically of a different duration than interval 326—here the durations are shown approximately equal only for purposes of illustration.

According to blocks 332 and 336, RFID reader 110 talks during interval 312, and listens during interval 326. According to blocks 342 and 346, RFID tag 120 listens while RFID reader 110 talks (during interval 312), and talks while RFID reader 110 listens (during interval 326).

In terms of actual technical behavior, during interval 312, RFID reader 110 talks to RFID tag 120 as follows. According to block 352, RFID reader 110 transmits wave 112, which was first described in FIG. 1. At the same time, according to block 362, RFID tag 120 receives wave 112 and processes it, to extract data and so on. Meanwhile, according to block 372, RFID tag 120 does not backscatter with its antenna, and according to block 382, RFID reader 110 has no wave to receive from RFID tag 120.

During interval 326, RFID tag 120 talks to RFID reader 110 as follows. According to block 356, RFID reader 110 transmits a Continuous Wave (CW), which can be thought of as a carrier signal that ideally encodes no information. This carrier signal serves both as a power source for RFID tag 120, and also as a wave that RFID tag 120 can backscatter modulate. Indeed, during interval 326, according to block 366, RFID tag 120 does not receive a signal for processing. Instead, according to block 376, RFID tag 120 modulates the CW emitted according to block 356, so as to generate backscatter wave 126. Concurrently, according to block 386, RFID reader 110 receives backscatter wave 126 and processes it.

Figure 4:
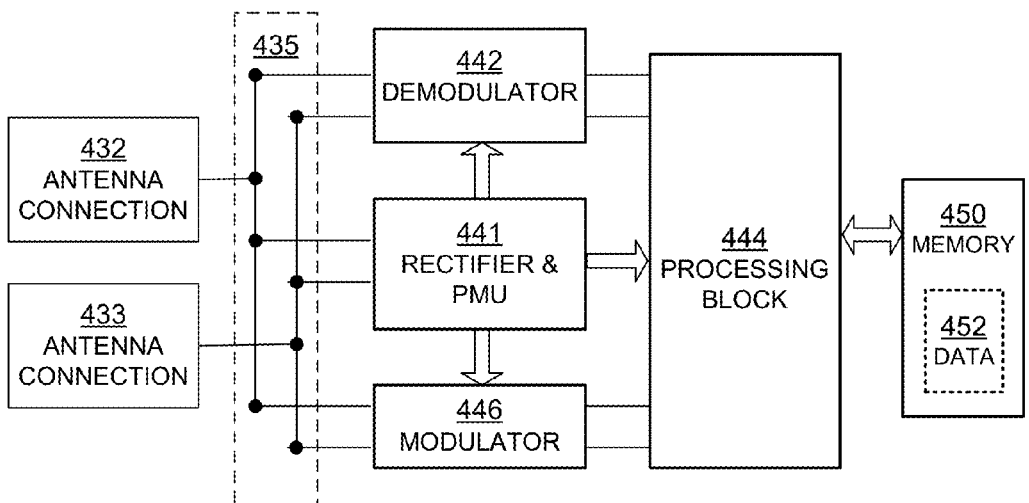
FIG. 4 is a block diagram showing components of a tag IC, such as the tag IC shown in FIG. 2.

FIG. 4 is a block diagram showing a detail of an RFID IC, such as the one shown in FIG. 2. Electrical circuit 424 in FIG. 4 may be formed in an IC of an RFID tag, such as IC 224 of FIG. 2. Circuit 424 has a number of main components that are described in this document, and may have a number of additional components different from what is shown and described, or different components, depending on the implementation.

Circuit 424 includes at least two antenna terminals 432, 433, which are suitable for coupling to one or more antenna segments (not shown in FIG. 4). Antenna terminals 432, 433 may be made in any suitable way, such as using pads, bumps, and so on. In a number of embodiments more than two antenna terminals are used, especially in embodiments where more antennas or antenna segments are used.

Circuit 424 includes a section 435. Section 435 may be implemented as shown, for example as a group of nodes for proper routing of signals. In some embodiments, section 435 may be implemented otherwise, for example to include a receive/transmit switch that can route a signal, and so on.

Circuit 424 also includes a Rectifier and PMU (Power Management Unit) 441. Rectifier and PMU 441 may be implemented in any way known in the art for extracting RF power received via antenna terminals 432, 433. In some embodiments, Rectifier and PMU 441 may include more than one rectifier.

In operation, an RF wave received via antenna terminals 432, 433 is received by Rectifier and PMU 441, which in turn generates power for the electrical circuits of IC 424. This is true for either or both reader-to-tag (R→T) and tag-to-reader (T→R) sessions, whether or not the received RF wave is modulated.

Circuit 424 additionally includes a demodulator 442. Demodulator 442 demodulates an RF signal received via antenna terminals 432, 433. Demodulator 442 may be implemented in any way known in the art, for example including an attenuator stage, an amplifier stage, and so on.

Circuit 424 further includes a processing block 444. Processing block 444 receives the demodulated signal from demodulator 442, and may perform operations. In addition, it may generate an output signal for transmission.

Processing block 444 may be implemented in any way known in the art. For example, processing block 444 may include a number of components, such as a processor, memory, a decoder, an encoder, and so on.

Circuit 424 additionally includes a modulator 446. Modulator 446 modulates an output signal generated by processing block 444. The modulated signal is transmitted by driving antenna terminals 432, 433, and therefore driving the load presented by the coupled antenna segment or segments. Modulator 446 may be implemented in any way known in the art, for example including a driver stage, amplifier stage, and so on.

Circuit 424 additionally includes a memory 450, which stores data 452. Memory 450 is preferably implemented as a Nonvolatile Memory (NVM), which means that data 452 are retained even when circuit 424 does not have power, as is frequently the case for a passive RFID tag.

Circuit 424 operates differently during a R→T session and a T→R session. The different operations are described below, in this case with circuit 424 representing an IC of an RFID tag.

Figure 5A:
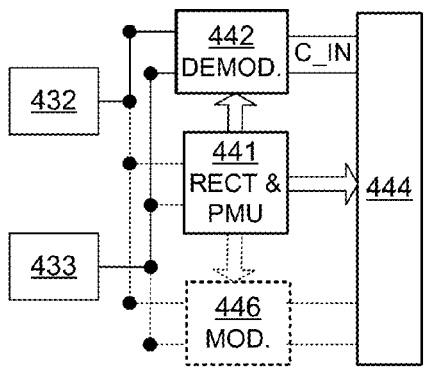
FIGS. 5A and 5B illustrate signal paths during reader-to-tag and tag-to-reader communications in the block diagram of FIG. 4.

FIG. 5A shows version 524-A of components of circuit 424 of FIG. 4, further modified to emphasize a signal operation during a R→T session (receive mode of operation) during time interval 312 of FIG. 3. An RF wave is received by antenna terminals 432, 433; Rectifier and PMU 441 extract RF power from the wave to power IC 424; a signal is demodulated from the RF wave by demodulator 442; and the demodulated signal is input to processing block 444 as C_IN. In one embodiment, C_IN may include a received symbol stream.

Version 524-A shows as relatively obscured those components that do not play a part in processing a signal during a R→T session. Modulator 446 generally does not transmit during a R→T session, and typically does not interact with the received RF wave significantly, either because switching action in section 435 of FIG. 4 decouples modulator 446 from the RF wave, or because processing block 444 does not provide data to modulator 446, or because modulator 446 is designed with a suitable impedance, or for any other reason suitable to cause modulator 446 not to modulate the RF wave.

Although modulator 446 typically does not modulate during a R→T session, in some embodiments it may be active. For example, modulator 446 may adjust its own parameters for operation in a future session.

Figure 5B:
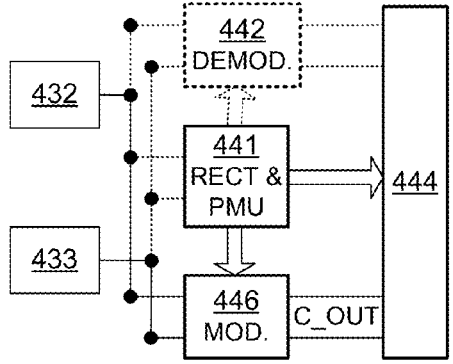

FIG. 5B shows version 524-B of components of circuit 424 of FIG. 4, further modified to emphasize a signal operation during a T→R session during time interval 326 of FIG. 3. A signal is output from processing block 444 as C_OUT. In one embodiment C_OUT may include a symbol stream for transmission. C_OUT is then modulated by modulator 446 and output as, or superimposed on, an incident RF wave via antenna terminals 432, 433. Rectifier and PMU 441 extract RF power from the wave to power IC 424.

Version 524-B shows as relatively obscured those components that do not play a part in processing a signal during a T→R session. Demodulator 442 generally does not receive during a T→R session, and typically does not interact with the transmitted RF wave significantly, either because switching action in section 435 decouples demodulator 442 from the RF wave, or because demodulator 442 is powered down during a T→R session, or because demodulator 442 is designed with a suitable impedance, or for any other reason suitable to cause demodulator 442 not to demodulate the RF wave.

Although demodulator 442 typically does not demodulate during a T→R session, in some embodiments it may be active. For example, demodulator 442 may adjust its own parameters for operation in a future session.

An RFID tag, especially a passive RFID tag, is preferably designed to extract as much power as possible from RF waves received by the tag antenna to power the IC. The efficiency of the power extraction process depends in part on the impedance matching between the antenna and the IC. The extracted power is maximized when the antenna impedance is the complex conjugate of the IC input impedance. Any impedance mismatch between antenna impedance and IC input impedance reflects power from the IC back to the antenna, decreasing the power transfer from the antenna to the IC and thereby decreasing the power extraction efficiency. Often the antenna, the IC, or both contain a matching network to "match" the antenna source impedance to the IC input impedance. The matching network can be formed as part of the antenna, part of the IC, part of both, or as a standalone component.

Figure 6:
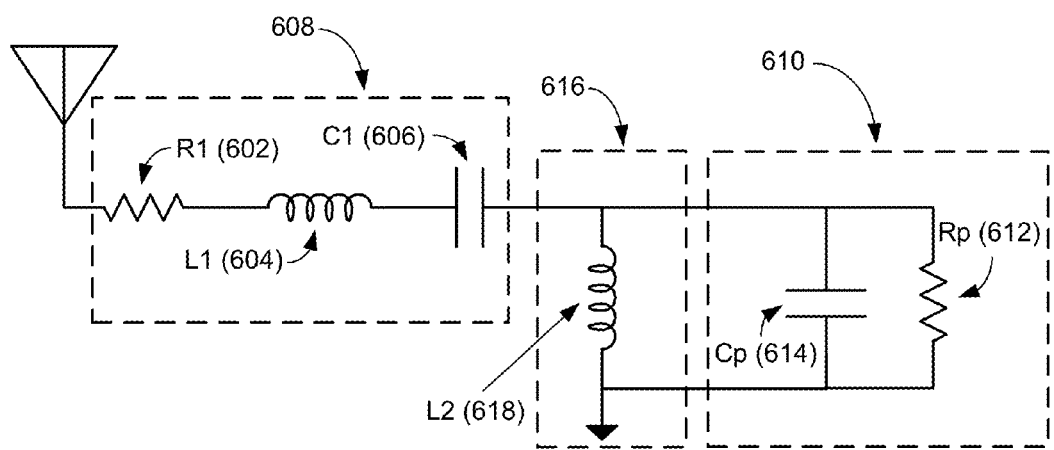
FIG. 6 depicts an RFID tag front-end equivalent circuit.

FIG. 6 is a diagram of an RFID tag front-end equivalent circuit 600. RFID tag front-end equivalent circuit 600 models the various impedances of an RFID tag and includes an antenna section 608, an IC input section 610, and a matching network 616 that couples the antenna section 608 to the IC input section 610. The antenna section 608 includes inductor L1 604 and capacitor C1 606, which model the reactive portion of the antenna impedance, and resistor R1 602, which models the real portion of the antenna impedance. The IC input section 610 includes a resistor Rp 612 that models the input resistance of the IC, and a capacitor Cp 614 that models the input reactance of the IC. Matching network 616 includes inductor L2 618 that models the inductance of the matching network 616.

To maximize power transfer between antenna and IC in equivalent circuit 600, the reactance of inductor L1 604 should be the complex conjugate of the reactance of capacitor C1 606, and the reactance of inductor L2 618 should be the complex conjugate of the reactance of capacitor Cp 614. In this "matching" situation the equivalent circuit 600 reduces to the resistors R1 602 and Rp 612 in series.

Typical matching networks use components with static values, and therefore can only maximize power transfer and extraction for particular values of antenna and IC impedance. However, antenna and IC impedance values can vary greatly. For example, RFID tags often operate over a range of frequencies. Because antenna and IC impedances vary as a function of frequency, a matching network that is configured for maximum power transfer at one frequency may not maximize power transfer at a different frequency.

Other factors may also cause impedance variations and degrade power transfer. Statistical variations in component values during manufacturing may cause the actual antenna and IC impedances to differ from their designed values. Similarly, the environment in which the tag operates (e.g., operating medium such as air, water, etc., or environmental conditions such as temperature, humidity, time, pressure, etc.) or the dielectric properties of an item to which the tag is attached may alter the effective antenna impedance. Consequently, designing a matching network with static-valued components involves design compromises that typically provide good power-conversion efficiency in some circumstances but lower efficiency in other circumstances.

Figure 7:
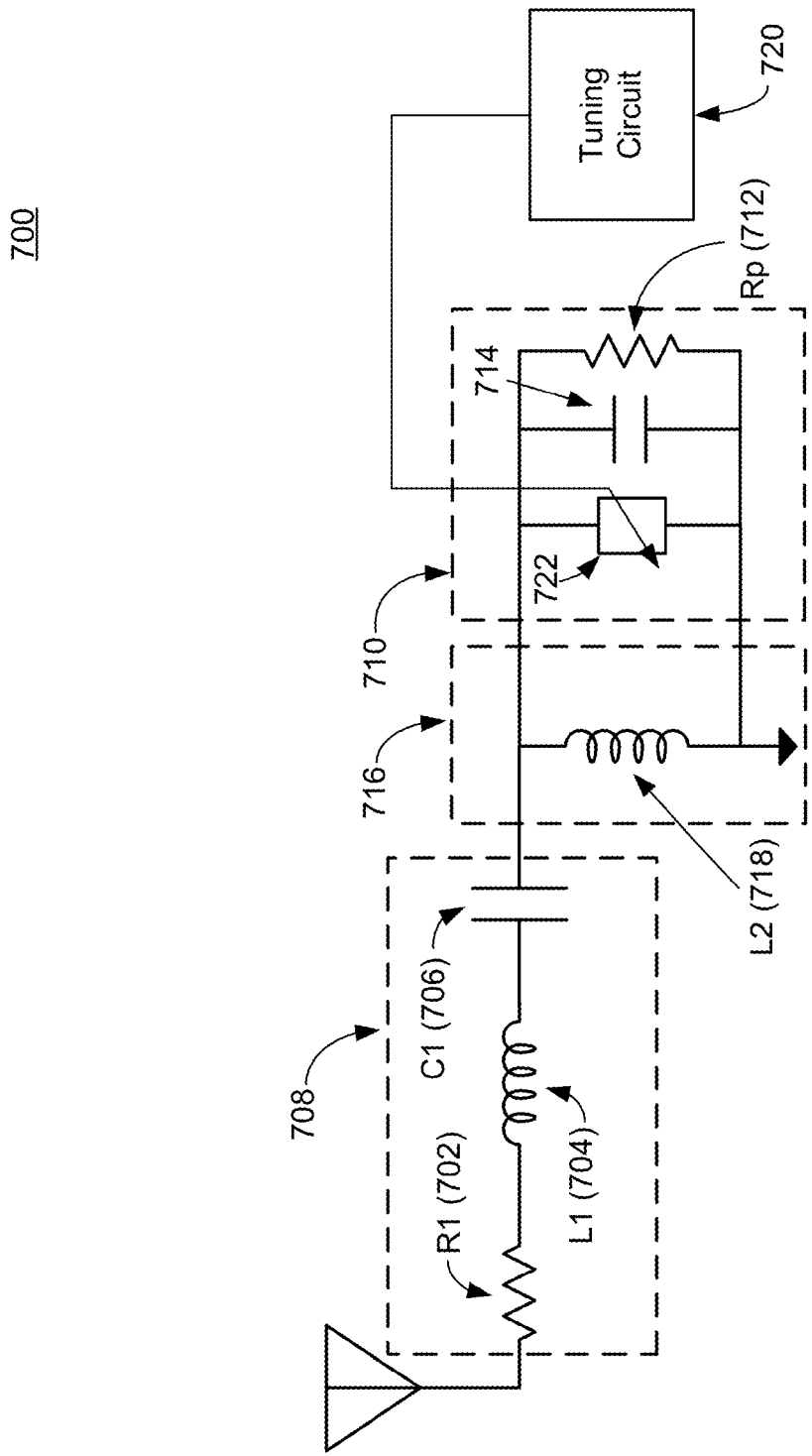
FIG. 7 depicts an RFID tag front-end equivalent circuit including a tuning circuit.

FIG. 7 is a diagram of an RFID tag front-end equivalent circuit 700 including a tuning circuit 720. Equivalent circuit 700 is similar to equivalent circuit 600 described above in relation to FIG. 6. and further includes variable impedance 722, the additional tuning circuit 720, and capacitor 714, which may be similar to Cp 614 or may have a value chosen to allow an increased tuning range for variable impedance 722. Variable impedance 722 in circuit 700 can be adjusted (via tuning circuit 720). If there is an impedance mismatch between antenna 708 and IC 710 then tuning circuit 720 can adjust the variable impedance 722 to compensate Tuning circuit 720 in circuit 700 can be a standalone circuit or it can be integrated into an IC circuit block, such as one of the blocks in IC 424 of FIG. 4. Variable impedance 722 may be implemented as a continuously variable element or as one or more switched capacitors. Of course, as will be apparent to one of ordinary skill in the art, variable impedance 722 can include one or more variable capacitor(s), variable inductor(s), variable-length transmission line(s), variable resistors, etc. Any of these elements can be continuously variable or discretely variable (i.e. switched). For example, the variable impedance may include one or more switched capacitors, switched inductors, switched transmission lines, and/or switched resistors. In some embodiments, the variable impedance may only provide resistive components (i.e., no capacitors, inductors, or transmission lines). In one example embodiment variable impedance 722 may be an array of switchable capacitors which is adjusted by tuning circuit 720.

In some embodiments, tuning circuit 720 is operable at an RF power level lower than that needed to operate the rest of the tag IC. For example, suppose that an RFID tag without tuning circuit 720 receives incident RF power sufficient to power the tag IC, but suffers from an impedance mismatch between the antenna and the IC such that the antenna does not transfer enough power to the IC to enable operation. In this case the incident RF field must be increased to enable to IC to operate. Now suppose that the tag is equipped with variable impedance 722 and with tuning circuit 720. Further suppose that tuning circuit 720 is able to operate at an incident RF power level below the threshold for IC operation. In this case the tuning circuit can power-up and adjust variable impedance 722 to reduce the impedance mismatch and improve power transfer between the antenna and the IC, thereby allowing the IC to extract enough power from the incident RF wave to operate.

Figure 8:
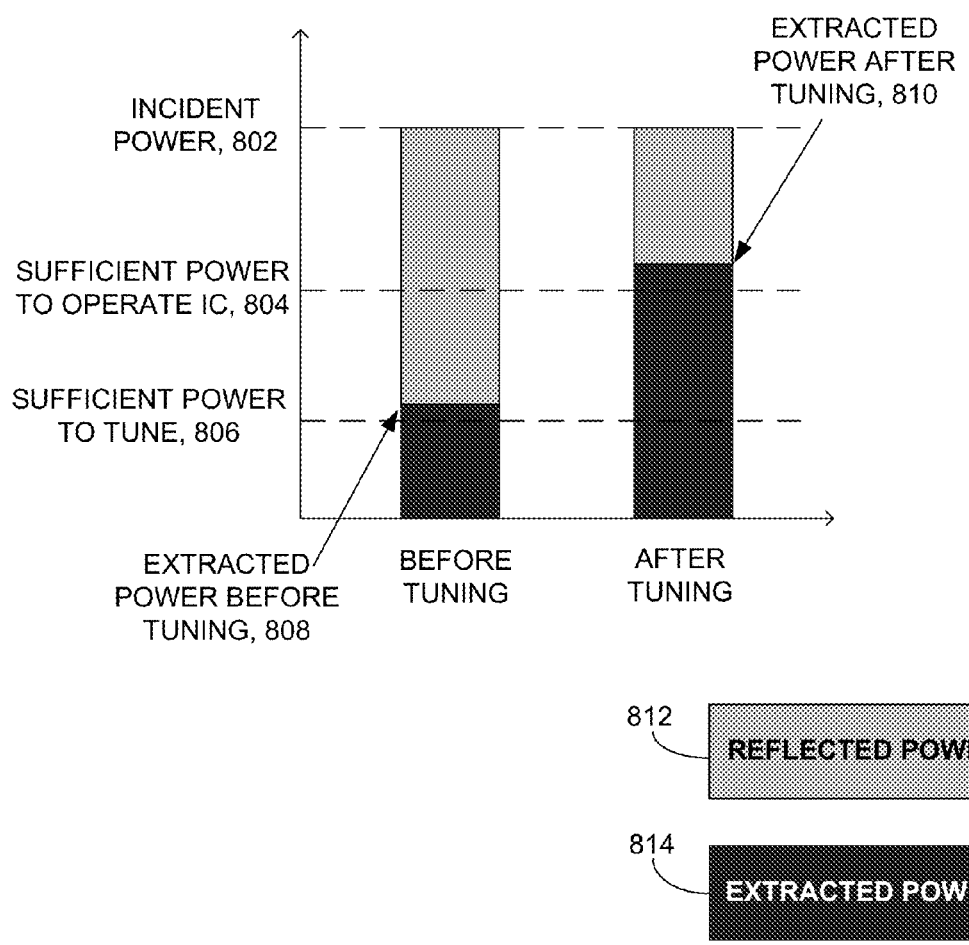
FIG. 8 illustrates the amount of power extracted and lost before and after tuning according to embodiments.

FIG. 8 is a chart 800 depicting power extracted (represented by black, 814) by an IC such as IC 424 of FIG. 4 and power lost (represented by gray, 812) by an RFID IC during a tag tuning process. Power may be lost via reflection due to an impedance mismatch or due to resistive losses within the antenna, matching network, and/or IC. The vertical axis of chart 800 measures power and the horizontal axis shows two time periods: before the tuning process (left) and after the tuning process (right).

The RF power incident on the tag is the same for both time periods, as shown by incident power indicator 802. The IC (e.g., IC 424) requires a minimum amount of extracted power to operate, as indicated by the "sufficient power to operate IC" (or SPOT) requirement 804, and the tuning circuit (e.g., tuning circuit 720) requires a different, smaller amount of extracted power to operate, as indicated by the "sufficient power to tune" (or SPTT) requirement 806. Before tuning, much of the incident power is reflected and lost (represented by gray). As a result, the efficiency of the power extraction process (defined as the ratio of power extracted to total incident power) is relatively low, and the extracted power before tuning (EPBT) 808 is insufficient to meet SPOI requirement 804 so the IC does not operate. However, the EPBT 808 is sufficient to meet the SPTT requirement 806, and therefore the tuning circuit 720 does have sufficient power to operate. The tuning circuit 720 adjusts variable impedance 722 to improve the impedance matching, thereby increasing the efficiency of the power extraction process and improving the power transfer between the antenna and IC. The extracted power after tuning (EPAT) 810 is larger than EPBT 808 as a result of the increased power extraction efficiency, and is sufficient to meet the SPOI requirement 804 and operate the IC even though the incident power 802 remains unchanged.

As described above, tuning circuit 720 adjusts variable impedance 722 to match the IC input impedance to the tag antenna impedance and thereby improve power transfer from the antenna to the IC. Tuning circuit 720 may adjust the variable impedance 722 based on stored data, real-time data, or a combination of both. And as described above, in the more general circuit implementation the variable impedance can be any variable reactive element such as a variable inductor.

Figure 9:
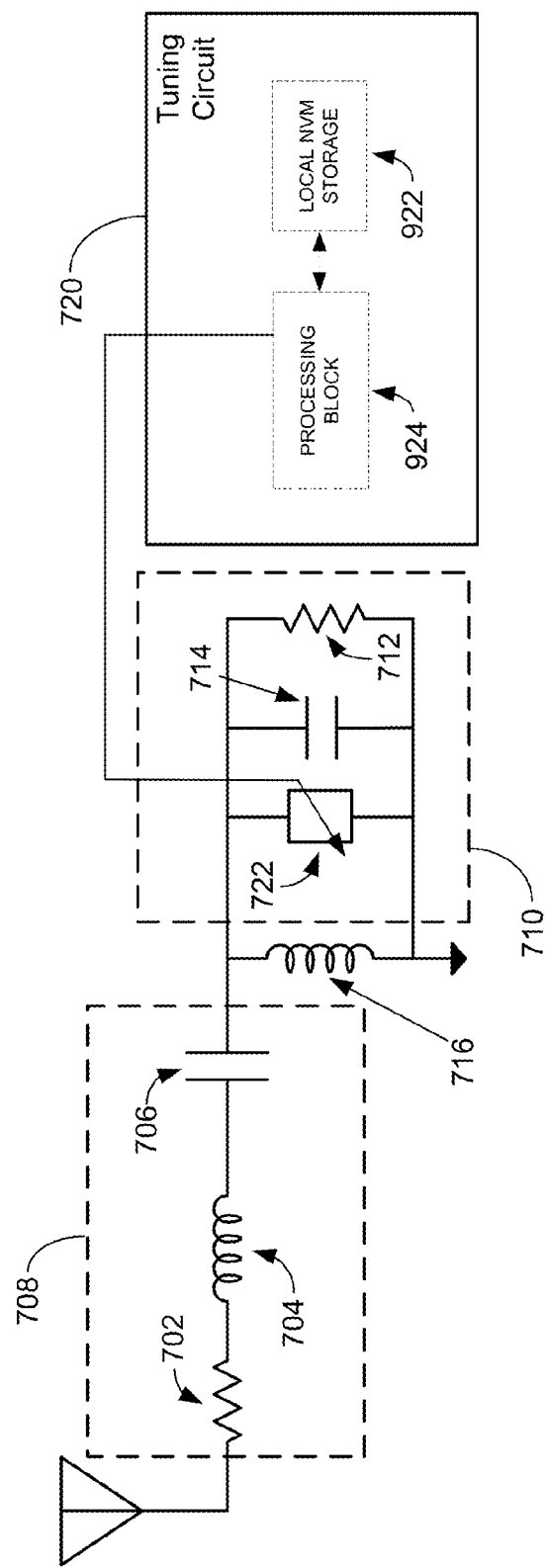
FIG. 9 illustrates an RFID tag front-end equivalent circuit including a tuning circuit with a processing block and a memory.

FIG. 9 illustrates an RFID tag front-end equivalent circuit 900 including a tuning circuit and a memory for storing tuning data, according to one embodiment. Tag equivalent circuit 900 is similar to tag equivalent circuit 700 in FIG. 7. In FIG. 9, tuning circuit 720 includes an additional nonvolatile memory (NVM) 922 coupled to a processing block 924. NVM 922, which is configured to store and maintain data even in the absence of power, may include one or more of ROM, EEPROM, flash, MRAM, FRAM, fuses, or other memory types known in the art for storing data, and may be one-time-programmable or may be able to be written to and/or erased repeatedly. NVM 922 stores information about the tag tuning, such as settings for variable impedance 722 under various environmental conditions. These settings may be pre-programmed into the NVM before or after the IC is integrated into an RFID tag.

In some embodiments the settings stored in NVM 922 may be dynamically adjusted. For example, in the course of a tag-tuning process (e.g., process 1100 described below in relation to FIG. 11) the stored variable-impedance settings may be overwritten or supplemented by new settings that provide better impedance matching.

NVM 922 may also store data about the power extracted and/or reflected by the tag. For example, NVM 922 may store previous values of extracted and/or reflected power for use in an iterative tag-tuning process, where successively detected values of extracted/reflected power are used to evaluate the effect of variable-impedance adjustments.

Processing block 924 is typically configured to adjust variable impedance 722 to increase the amount of power that IC 424 extracts from an incident RF wave. Processing block 924 may adjust variable impedance 722 based on impedance settings stored in NVM 922, based on previous extracted/reflected power data stored in NVM 922, and/or based on one or more impedance-adjustment algorithms. Processing block 924 may also update or overwrite the stored impedance settings if new settings provide more extracted RF power. In some embodiments processing block 924 may adjust the impedance upon command from an external entity (e.g., an RF reader). In other embodiments processing block 924 may also (or instead) adjust the impedance based on one or more environmental conditions. In some embodiments processing block 924 may adjust the impedance every time there is SPTT. For an example of the latter, processing block 924 may adjust the impedance when the power extracted by the IC exceeds SPTT 806 in FIG. 6 and tuning circuit 720 has sufficient power to operate.

Figure 10:
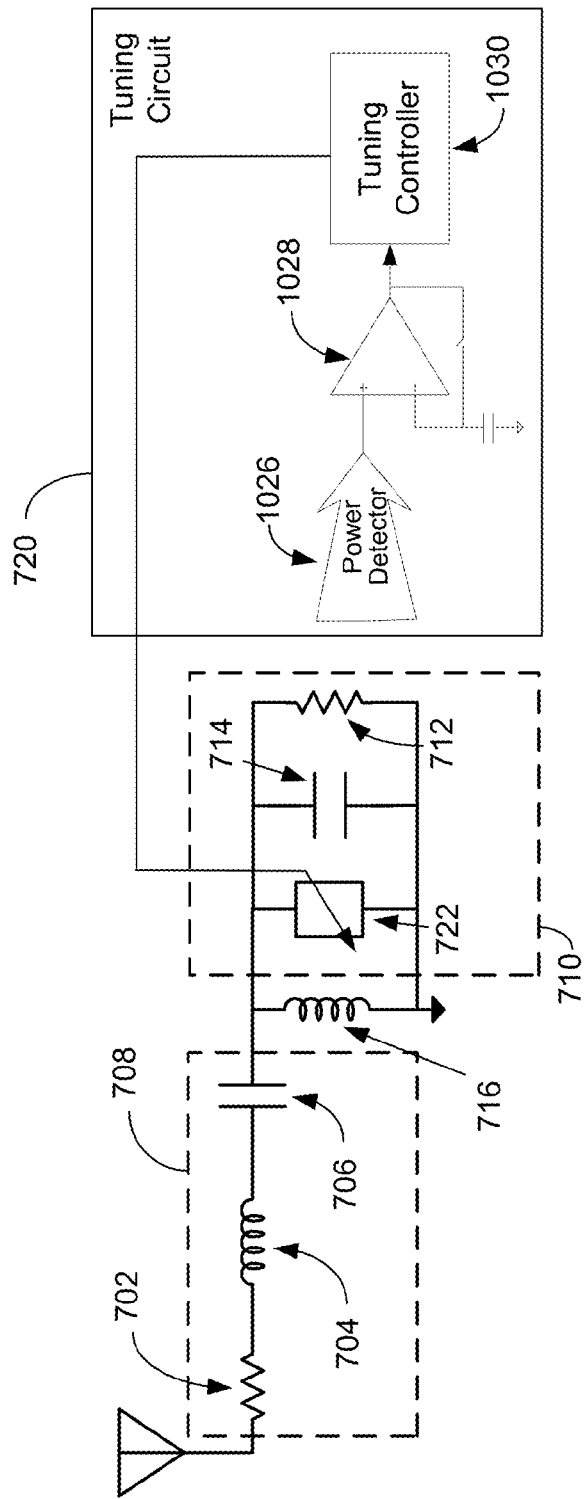
FIG. 10 illustrates a more detailed view of an RFID tag front-end equivalent circuit including a tuning circuit, according to embodiments.

FIG. 10 illustrates a more detailed view of an RFID tag front-end equivalent circuit 1000 including a tuning circuit 720, according to embodiments. In circuit 1000, tuning circuit 720 may be configured to determine an amount of extracted power and to adjust variable impedance 722 based on the amount. In one embodiment, a power detector 1026, which may be integrated into tuning circuit 720 or into another circuit in IC 424 (e.g., in a rectifier or PMU), detects the amount of RF power extracted by the IC from the tag antenna (e.g. tag antenna 227 in FIG. 2). In one example, power detector 1026 may simply be the supply voltage developed by IC 424 from the incident RF wave.

A tuning controller 1030 may adjust variable impedance 722 to improve the impedance match and thereby increase the extracted power. A comparator 1028 determines whether the extracted power is increasing or decreasing as the tuning controller adjusts the variable impedance and allows the tuning controller to optimize the impedance value for maximum power transfer.

As described above, tuning circuit 720 may be configured to operate at lower extracted power levels than IC 424. In some embodiments, a rectifier or PMU may disable IC 424 until the tuning circuit has maximized the extracted power and/or the amount of extracted power is sufficient to operate IC 424.

Figure 11:
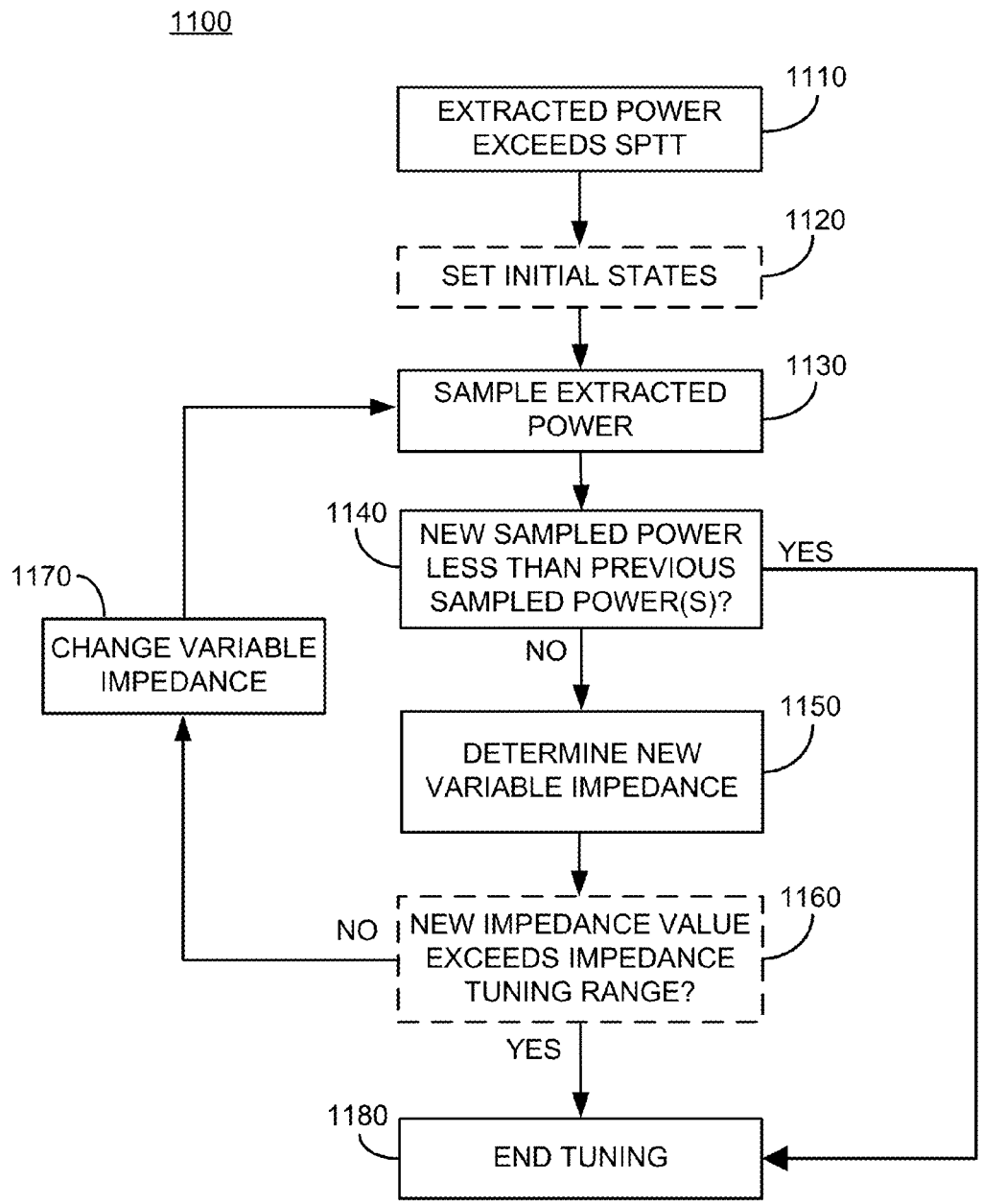
FIG. 11 is a flowchart for an RFID tag tuning process according to embodiments.

FIG. 11 is a flowchart for an RFID tag tuning process 1100 according to embodiments. Tuning process 1100 begins with step 1110, where an RFID tag with an antenna, an IC, a variable impedance, and a tuning circuit extracts power from an incident RF wave at a level exceeding the SPTT 806 in FIG. 8. In some instances the extracted power will be less than SPOI 804 in FIG. 8, in which case the tag IC will not have sufficient power to operate according to a protocol. However, tuning circuit 720 does operate, because the extracted power is greater than the SPTT. In optional step 1120, the variable impedance resets to an initial state. In some instances tuning circuit 720 may set the initial state via a tuning algorithm, or retrieve the initial state from a memory (e.g., NVM 922 in FIG. 9) and apply it to the variable impedance, or may use the variable impedance's previous state as the initial state. In other instances the variable impedance will set or reset itself to the initial state.

In step 1130, the tuning circuit samples the power extracted by the RFID tag, either to determine a baseline value (at the beginning of the tuning process) or to evaluate the effect of an impedance change (during the tuning process). If the latter then the tuning circuit in step 1140 determines if the newly sampled power value is less than one or more previously sampled power values. If not then the tuning continues. If so then the tuning circuit may assume that the power transfer and extraction has been maximized, and the process then moves to step 1180 where the tuning circuit halts the adjustment process. In some embodiments the criterion for whether the impedance value has been optimized and the extracted power has been maximized may be complex, especially in cases where the relationship between the variable impedance and the extracted power is not monotonic. In such circumstances the tuning circuit may use a search algorithm (in some cases including techniques available to those versed in computer science and/or machine learning) to determine if the power transfer can be improved further, even if the newly sampled power value is less than prior samples.

If the newly sampled power value exceeds the previously sampled value(s) or if the tuning circuit determines that power transfer can be further improved then the tuning circuit determines a new variable impedance value in step 1150. The tuning circuit may determine the impedance value in a variety of ways, such as using fixed steps, binary tree-traversal, proportional to the prior improvement, or using another algorithm as will be well known to those skilled in the engineering discipline. The new impedance value will, in general, be based on the most recent sampled power value (and in some embodiments, multiple previous power samples). In step 1160 the tuning circuit may optionally check if the new impedance value exceeds the tuning range of the variable impedance range. If so then the tuning circuit may halt the tuning process at step 1180.

If the new impedance value does not exceed the variable-impedance tuning range then the tuning circuit adjusts the variable impedance in step 1170. The tuning process then loops back to step 1130, where a new sample of the extracted power is taken to evaluate the effect of the newly adjusted impedance. The tuning process 1100 iterates through steps 1130-1170 until the extracted power in step 1140 reaches a maximum (implying the impedance match is optimized) or until further impedance adjustments would exceed the tuning range of the variable impedance (i.e. step 1160).

At the conclusion of tuning process 1100, in step 1180, the final variable impedance settings may be stored in a tag memory (e.g., in NVM 922 in FIG. 9). In some embodiments an RFID reader may be able to read the final variable impedance settings from the memory or instruct the tag IC to transmit them to the reader.

In some embodiments, both the extracted power and the reflected power may be sampled in step 1130 and used in the determination of step 1140. In these embodiments, increases in extracted power coupled with decreases in reflected power correspond to improved power transfer. The additional information provided by the reflected power may be useful, for example, in cases where the RFID tag is moving with respect to the RF power source and therefore the incident power is changing. By itself, an increase in extracted power after a impedance adjustment may result from a tag moving closer to a power source and not from better power transfer. However, by measuring both extracted and reflected power the tuning circuit can determine if the increase in extracted power is due to tag motion or to the impedance adjustment.

The steps described in process 1100 are for illustrative purposes only. An RFID IC may adjust a variable impedance to improve power transfer using additional or fewer steps and in different orders using the principles described herein. Steps may be reordered, eliminated, or added according to other embodiments. For example, in some embodiments, a tag may set its variable impedance based on a reader command or by directly loading stored impedance settings instead of using an iterative process.

The foregoing detailed description has set forth various embodiments of the devices and/or processes via the use of block diagrams and/or examples. Insofar as such block diagrams and/or examples contain one or more functions and/or aspects, it will be understood by those within the art that each function and/or aspect within such block diagrams or examples may be implemented, according to embodiments formed, individually and/or collectively, by a wide range of hardware, software, firmware, or virtually any combination thereof.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, configurations, antennas, transmission lines, and the like, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). It will be further understood that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

We claim:

1. A Radio Frequency Identification (RFID) tag, comprising:
   an antenna;
   a variable impedance; and
   an integrated circuit (IC) including a tuning circuit coupled to the variable impedance, the IC requiring a sufficient power to operate according to a protocol (SPOI), the tuning circuit requiring a sufficient power to tune the variable impedance (SPTT), the SPOI greater than the SPTT, wherein the IC is configured to:
      extract, before tuning the variable impedance, a first power greater than the SPTT from an RF wave incident on the antenna;
      tune the variable impedance according to a search algorithm to increase power extraction;
      extract, after tuning the variable impedance, a second power greater than the SPOI from the RF wave incident on the antenna;
      operate according to the protocol using the second power; and
      send a variable impedance setting corresponding to the tuning to an RFID reader.

2. The tag of claim 1, wherein the search algorithm is implemented using at least one of fixed steps, binary tree-traversal, and proportionality to a prior power-extraction improvement.

3. The tag of claim 1, wherein the IC is further configured to prevent the operation of at least one other IC circuit while tuning the variable impedance.

4. The tag of claim 1, wherein adjusting the variable impedance includes setting the variable impedance to an initial state.

5. The tag of claim 1, wherein adjusting the variable impedance includes determining an adjustment based on a difference between a current extracted power and a prior extracted power.

6. The tag of claim 1, wherein the IC is configured to tune the variable impedance in response to a reader command.

7. The tag of claim 1, wherein the IC:
uses a measurement of the extracted first power to determine the tuning of the variable impedance; and
halts the tuning when at least one of the extracted first power decreases and an impedance value exceeds a tuning range.

8. A Radio Frequency Identification (RFID) integrated circuit (IC) requiring a sufficient power to operate according to a protocol (SPOI), the IC comprising at least a variable impedance and a tuning circuit coupled to the variable impedance, the tuning circuit requiring a sufficient power to tune the variable impedance (SPTT), and the SPOI greater than the SPTT, wherein the IC is configured to:
extract, before tuning the variable impedance, a first power greater than the SPTT from an RF wave;
tune the variable impedance to increase power extraction;
extract, after tuning the variable impedance, a second power greater than the SPOI from the RF wave; and
operate according to the protocol using the second power.

9. The IC of claim 8, further configured to store a variable impedance setting corresponding to the tuning in a memory.

10. The IC of claim 8, further configured to prevent the operation of at least one other IC circuit while tuning the variable impedance.

11. The IC of claim 8, further configured to tune the variable impedance by setting the variable impedance to an initial state.

12. The IC of claim 8, further configured to tune the variable impedance by determining an adjustment based on a difference between a current extracted power and a prior extracted power.

13. The IC of claim 8, further configured to tune the variable impedance in response to a command.

14. The IC of claim 8, further configured to:
use a measurement of the extracted first power to determine the tuning of the variable impedance; and
halt the tuning when at least one of the extracted first power decreases and an impedance value exceeds a tuning range.

15. A method for adjusting a power extraction of a Radio Frequency Identification (RFID) integrated circuit (IC) comprising at least a variable impedance and a tuning circuit coupled to the variable impedance, wherein the IC requires a sufficient power to operate according to a protocol (SPOI), the tuning circuit requires a sufficient power to tune the variable impedance (SPTT), and the SPOI is greater than the SPTT, the method comprising:
causing the IC to extract, before tuning the variable impedance, a first power greater than the SPTT from an RF wave;
causing the IC to tune the variable impedance to increase the power extraction;
causing the IC to extract, after tuning the variable impedance, a second power greater than the SPOI from the RF wave;
causing the IC to store a variable impedance setting corresponding to the tuning; and
causing the IC to operate according to the protocol using the second power.

16. The method of claim 15, wherein the IC is further configured to prevent the operation of at least one other IC circuit while tuning the variable impedance.

17. The method of claim 15, wherein adjusting the variable impedance includes setting the variable impedance to an initial state.

18. The method of claim 15, wherein adjusting the variable impedance includes determining an adjustment based on a difference between a current extracted power and a prior extracted power.

19. The method of claim 15, wherein storing the variable impedance setting includes storing the setting in a memory of the IC.

20. The method of claim 15, wherein the IC:
uses a measurement of the extracted first power to determine the tuning of the variable impedance; and
halts the tuning when at least one of the extracted first power decreases and an impedance value exceeds a tuning range.

* * * * *